(12) United States Patent
Kim

(10) Patent No.: US 10,305,575 B2
(45) Date of Patent: May 28, 2019

(54) MOBILE TELECOMMUNICATION REPEATER FOR CANCELING FEEDBACK SIGNALS

(71) Applicant: ADVANCED RF TECHNOLOGIES, INC., Burbank, CA (US)

(72) Inventor: Jong-Min Kim, Seongnam (KR)

(73) Assignee: ADVANCED RF TECHNOLOGIES, INC., Burbank, CA (US)

( * ) Notice: Subject to any disclaimer, the term of this patent is extended or adjusted under 35 U.S.C. 154(b) by 163 days.

(21) Appl. No.: 13/841,447

(22) Filed: Mar. 15, 2013

(65) Prior Publication Data

US 2014/0194054 A1 Jul. 10, 2014

Related U.S. Application Data

(60) Provisional application No. 61/750,260, filed on Jan. 8, 2013.

(51) Int. Cl.
*H01Q 1/00* (2006.01)
*H03M 1/10* (2006.01)
(Continued)

(52) U.S. Cl.
CPC ......... *H04B 7/15585* (2013.01); *H01Q 1/007* (2013.01); *H03M 1/1052* (2013.01);
(Continued)

(58) Field of Classification Search
CPC .......... H04B 1/475; H04B 1/525; H04B 7/10; H04B 7/15; H04B 7/15507; H04B 7/15535; H04B 7/15542; H04B 7/15578; H04B 7/15585; H04B 17/02; H04B 1/109; H04B 1/71; H04B 7/15528; H04B 7/15564; H04B 17/15585; H04B 17/2606; H04B 7/2606; H04B 1/001; H04B 7/1555; H04B 7/15571; H04B 7/155; H04B 7/01; H04L 7/042; H04L 27/22; H04L 27/2663; H04L 2027/0026; H04L 25/002; H04L 25/0226; H04L 25/24; H04L 27/2613; H04L 27/368; H04L 25/02; H04L 25/14; H04L 27/265; H04W 52/46; H04W 52/52; H04W 88/04; H04W 52/10; H01Q 1/007; H01Q 1/246;
(Continued)

(56) References Cited

U.S. PATENT DOCUMENTS 4,383,331 A * 5/1983 Davidson ................. 455/24
4,776,032 A * 10/1988 Odate et al. ............. 455/24
(Continued)

*Primary Examiner* — Yuwen Pan
*Assistant Examiner* — Paul P Tran
(74) *Attorney, Agent, or Firm* — Lewis Roca Rothgerber Christie LLP

(57) ABSTRACT

A mobile telecommunication wireless repeater includes: a combination stage for combining a received signal with a feedback cancellation signal; a comparison stage for comparing an input signal of the combination stage with an output signal of the combination stage and determining a weighted value and a time offset value for a feedback signal to be cancelled, based on the comparison; and a recombination stage comprising one or more adaptive filters and configured to receive the weighted value and the time offset value and generate the feedback cancellation signal according to the weighted value and the time offset value.

15 Claims, 6 Drawing Sheets

(51) Int. Cl.
*H04B 7/155* (2006.01)
*H01Q 3/26* (2006.01)
*H01Q 21/28* (2006.01)
*H04L 25/24* (2006.01)

(52) U.S. Cl.
CPC ..... *H04B 7/15507* (2013.01); *H04B 7/15535* (2013.01); *H04B 7/15542* (2013.01); *H04B 7/15571* (2013.01); *H01Q 3/2611* (2013.01); *H01Q 21/28* (2013.01); *H04L 25/24* (2013.01)

(58) Field of Classification Search
CPC ...... H01Q 3/2611; H01Q 3/2647; H01Q 3/46; H01Q 21/061; H01Q 21/28; H01Q 23/00; H01Q 25/005; H01Q 21/29; G01S 19/25; G01S 5/0273; G01S 11/02; G01S 5/14; H03H 17/0294; H03H 21/0043; H03H 21/0067; H03M 1/1052
USPC ..... 455/1, 7, 9, 10, 11.1, 15, 16, 17, 18, 19, 455/20, 21, 22, 23, 24, 226.1, 234.1; 330/149; 342/198; 357.36; 348/735; 370/75, 97, 226, 274, 278, 279, 293, 315, 370/328, 492, 501; 375/211, 213, 214, 375/215, 224, 297, 319, 343
See application file for complete search history.

(56) References Cited

U.S. PATENT DOCUMENTS

| | | | | |
|---|---|---|---|---|
| 5,095,528 A | * | 3/1992 | Leslie et al. | 455/10 |
| 5,974,301 A | * | 10/1999 | Palmer | H04B 1/126 |
| | | | | 455/304 |
| 6,590,833 B1 | * | 7/2003 | Teller | G01S 3/8083 |
| | | | | 367/124 |
| 6,807,399 B1 | * | 10/2004 | Shim | H04B 7/15585 |
| | | | | 370/315 |
| 8,010,042 B2 | * | 8/2011 | Judd | G01S 19/25 |
| | | | | 455/11.1 |
| 8,135,339 B2 | * | 3/2012 | Ranson | H04B 7/15 |
| | | | | 455/24 |
| 2002/0085647 A1 | * | 7/2002 | Oishi | H03F 1/3247 |
| | | | | 375/297 |
| 2002/0121993 A1 | * | 9/2002 | Velazquez | H03M 1/1052 |
| | | | | 341/118 |
| 2006/0264174 A1 | * | 11/2006 | Moss | H04B 1/525 |
| | | | | 455/16 |
| 2006/0290819 A1 | * | 12/2006 | Benjebbour | H04B 1/1036 |
| | | | | 348/678 |
| 2008/0158034 A1 | * | 7/2008 | Clark | H04B 10/25133 |
| | | | | 341/155 |
| 2008/0205633 A1 | * | 8/2008 | Dyba | H04M 3/002 |
| | | | | 379/406.08 |
| 2009/0286474 A1 | * | 11/2009 | Park | H04B 7/15578 |
| | | | | 455/20 |
| 2010/0285733 A1 | * | 11/2010 | Gore | H04B 7/15535 |
| | | | | 455/7 |
| 2010/0285736 A1 | * | 11/2010 | Gore et al. | 455/7 |
| 2011/0064213 A1 | * | 3/2011 | Deng | H04B 3/23 |
| | | | | 379/406.08 |

* cited by examiner

MOBILE TELECOMMUNICATION REPEATER FOR CANCELING FEEDBACK SIGNALS

CROSS-REFERENCE TO RELATED APPLICATION

This non-provisional application claims priority to and the benefit of U.S. Provisional Application No. 61/750,260, filed Jan. 8, 2013, the entire content of which is incorporated herein by reference.

BACKGROUND

Field

The present invention relates generally to a mobile telecommunication repeater. More specifically, the invention relates to a wireless mobile telecommunication repeater for cancelling feedback signals. For example, embodiments of the present invention relate to a wireless mobile telecommunication repeater for reducing or preventing oscillations caused by feedback signals having the same or substantially the same frequency as the frequency of the signal inputted into the repeater.

Description of Related Art

One aspect of providing mobile telecommunication service relates to reducing or minimizing the number of shadow areas, or areas with reduced signal strength. Shadow areas may include areas where radio waves cannot typically be transmitted, such as in a large building, a campus, a stadium, a hospital, or a tunnel. Shadow areas may be changed into areas with improved (or good) signal quality by installing base stations or repeaters.

A repeater amplifies signals received from a Base Station ("BTS") or Mobile Station ("MS") and transmits the amplified signals to the BTS or MS to provide improved communication between the BTS and MS at shadow areas. A BTS may be, for example, a cellular site and an MS may be a cellular phone. For a downlink path between a BTS and an MS, a BTS signal amplified by the repeater may be transmitted to an MS. For an uplink path between an MS and a BTS, an MS signal amplified by the repeater may be transmitted to a BTS. A repeater may therefore improve communication between a BTS and an MS at shadow areas. Additionally, repeater installation may be a simpler and cheaper approach to improving communication in shadow areas than base station installation.

Depending on the type of link between a BTS and a repeater, the repeater may be a wired repeater that connects with the BTS through wires, or a wireless repeater that connects with the BTS through air.

A wired repeater generally does not experience oscillation issues caused by insufficient (or deficient) isolation between a donor antenna and a server antenna of the repeater, because the wired repeater generally does not have a donor antenna. The BTS and the repeater may be connected to each other through wires from the BTS to the repeater. However, there may be some difficulty in installing the wires from the BTS to the repeater.

A wireless repeater, on the other hand, may direct a signal from a BTS using a donor antenna of the repeater. In the case of a wireless repeater, it may be easier to connect with (or link) a BTS through the air, but the repeater may experience oscillation due to deficient isolation between the server (or transmitting) antenna and the donor (or receiving) antenna.

For a wireless repeater in which the wireless frequency of the inputted signal is the same or substantially the same as the wireless frequency of the outputted signal, oscillations (or repeater performance degradation) may be caused when the ratio (or level difference) between the signal strengths of the signals directly received from a BTS (or MS) and the feedback signal strengths at the repeater donor (or server) input is less than about 15~20 dB. Therefore, when a wireless repeater is installed in the field, sufficient isolation between the transmitting and receiving antennas should be obtained to provide more stable and optimized repeater coverage to the MS.

In a typical wireless repeater system, a transmitting antenna connected to an output port of the repeater should be physically isolated from a receiving antenna connected to an input port of the repeater to reduce or prevent oscillations (or repeater performance degradation) caused by insufficient (or deficient) isolation, which may be a limiting condition for installation of wireless repeaters. Oscillations caused by feedback signals are sometimes referred to as noise or interference. Various technologies to reduce or prevent oscillations in wireless repeaters have been developed to address such a limiting condition. For example, digital processing techniques are proposed in Korean Publication No. 10-2008-0112829 A by Kim, et al., titled "Digital Adaptation Interference Cancellation Repeater," and U.S. Pat. No. 6,745,003 by Maca, et al., titled "Adaptive cancellation for wireless repeaters."

FIG. 1 is a block diagram of a mobile telecommunication repeater for cancelling a feedback signal. FIG. 1 also illustrates a method of removing feedback signals using an adaptive filter. Feedback signals are removed by the adaptive filter using an algorithm for updating coefficients of the adaptive filter, as illustrated in FIG. 2.

In reference to FIG. 1, a wireless signal inputted into a receiving antenna 101 is down-converted to an intermediate frequency through a down-converter 102, and is converted to a digital signal through Analog to Digital Converter ("ADC") 103. A combination stage 104 cancels the feedback in the converted signal by combining the output of ADC 103 with a signal generated at the recombination (or regeneration) stage 105. The Digital to Analog Converter ("DAC") 106 then converts the output of the combination stage 104 into an analog signal at an intermediate frequency. The analog signal is up-converted through the up-converter 107 to a signal having a frequency that is the same or substantially the same as that of the signal inputted into the receiving antenna 101. The up-converted signal is outputted through the transmitting antenna 108.

An adaptive filter may be used at the recombination (or regeneration) stage to model the feedback path from the transmitting antenna 108 to the receiving antenna 101 and cancel its effect using an algorithm. Because coefficients of an adaptive filter have the ability to change in time, an adaptive filter can be useful when the feedback signal has a different amplitude, phase and/or delay value than the original input signal, which may be caused by environmental changes around an installed repeater. An adaptive filter may employ a feedback loop in the form of an error signal to adjust its transfer function according to an algorithm with changing parameters. For example, an adaptive filter may take both an original received signal and feedback signals as input, and may track feedback signals having certain delay values. The output of the adaptive filter will be changed continuously to remove the feedback signals having certain delay values. The quality of the signal outputted from the repeater may therefore have improved accuracy.

FIG. 2 is a block diagram of an adaptive filter that may be employed in the repeater of FIG. 1. The adaptive filter may be, for example, a digital filter employed at the recombination (or regeneration) stage 105.

Referring to FIG. 2, an input signal $s_k$ corresponding to a wireless signal received at the receiving antenna is combined with an external feedback signal $n_k$ corresponding to feedback received at the receiving antenna from the external environment. The signals $s_k$ and $n_k$ are combined at combination element 201 to form a signal $d_k$. The signal $d_k$ is combined with an internally produced feedback cancellation signal $y_k$ at combination element 202 to form a signal $e_k$ in which at least a portion of the feedback has been removed.

The signal $e_k$ is inputted into the shaping (or final) filter 205 and is outputted from the shaping (or final) filter 205 as signal $p_k$. The signal $p_k$ represents the signals transmitted at the antenna port. The feedback signal of $p_k$ becomes $n_k$ and the expression $h_k$ expresses the transfer function for multiple paths between the donor antenna and server antenna.

The internally produced feedback cancellation signal $y_k$ is provided by the adaptive filter 203. The adaptive filter 203 takes both the signal $e_k$ and the signal $x_k$, which contains delay information of the outputted signal $p_k$, as inputs. The adaptive filter 203 has a transfer function $W_k$, and coefficients of the adaptive filter 203 are a function of the fixed weighted value $\mu$, the signal $e_k$, and the signal $x_k$ as shown in Equation (1). Because the weighted value $\mu$ is fixed and the adaptive filter continues to be updated by the outputted signal $e_k$, even if the feedback signal is completely removed by the feedback cancellation signal $y_k$, complete convergence may be difficult (i.e., the value of $2\mu \cdot e_k \cdot x_k$ cannot reach a zero value) and the quality of the signal may be degraded.

$$W_{k+1} = W_k + 2\mu \cdot e_k \cdot x_k \qquad (1)$$

Additionally, an adaptive filter may need to cancel multiple feedback signals that are re-inputted from the external environment. However, when a single adaptive filter 302 is used as shown in FIG. 3, and the feedback signals 305, 306, 307 on the time axis 301 have different delays with long intervals, it may be difficult to use the adaptive filter 302 to cancel such feedback signals with long delay intervals.

SUMMARY

Aspects of the present invention relate to a wireless mobile telecommunications repeater having a function for feedback signal cancellation. According to embodiments of the present invention, a function for feedback signal cancellation may cancel feedback signals which cause repeater oscillation or the degradation of signal quality through real time measurement, using a comparison of signals before and after the feedback signal cancellation and applying a weighted value for cancellation of the feedback signal.

According to one embodiment, a mobile telecommunication wireless repeater includes: a combination stage for combining a received signal with a feedback cancellation signal; a comparison stage for comparing an input signal of the combination stage with an output signal of the combination stage and determining a weighted value and a time offset value for a feedback signal to be cancelled, based on the comparison; and a recombination stage comprising one or more adaptive filters and configured to receive the weighted value and the time offset value and generate the feedback cancellation signal according to the weighted value and the time offset value.

The comparison stage may be configured to determine the weighted value based on an energy difference between the feedback signal to be cancelled and the output signal of the combination stage after feedback cancellation, and provide the weighted value to the recombination stage.

When the feedback signal is completely cancelled, the weighted value may be adjusted to a minimum value.

The comparison stage may be configured to determine the time offset value based on a time difference between the feedback signal to be cancelled and the output signal of the combination stage after feedback cancellation, and provide the time offset value to the recombination stage.

The recombination stage may be configured to determine a final weighted value by adding the weighted value determined by the comparison stage to an existing weighted value, and apply the final weighted value to the one or more adaptive filters.

The recombination stage may be configured to apply the time offset value determined by the comparison stage to a delay function of the one or more adaptive filters such that a time offset of the feedback cancellation signal corresponds to a time offset of a feedback signal to be cancelled.

The recombination stage may include a plurality of stages for adjusting a plurality of time offset values of a plurality of feedback signals to be cancelled.

The plurality of stages may be configured to independently adjust each of the time offset values.

The recombination stage may include a plurality of stages for adjusting a plurality of weighted values of filter coefficients of the one or more adaptive filters.

The plurality of weighted values may respectively correspond to a plurality of feedback signals to be cancelled and the plurality of stages may be configured to independently adjust each of the weighted values.

The mobile telecommunication wireless repeater may further include: a receiving antenna for receiving the received wireless signal; a down-converter stage for converting the received wireless signal to an intermediate frequency; an Analog to Digital Converter (ADC) stage for converting the wireless signal of the intermediate frequency to a digital signal; a Digital to Analog Converter (DAC) stage for converting the output signal of the combination stage to an analog signal of the intermediate frequency; and an up-converter stage for converting the analog signal of the intermediate frequency to a wireless RF signal and outputting the wireless RF signal to a transmitting antenna.

According to another embodiment of the present invention, a method of cancelling feedback from a received signal includes: combining the received signal with a current feedback cancellation signal; comparing the received signal before the combination with an output signal after the combination; determining a weighted value and a time offset value of a feedback signal to be cancelled, based on the comparison; generating, by one or more adaptive filters, a further feedback cancellation signal based on the weighted value and the time offset value; and applying the further feedback cancellation signal in place of the current feedback cancellation signal.

The weighted value may be determined according to an energy difference between the feedback signal to be cancelled and the output signal after combination with the current feedback cancellation signal.

The time offset value may be determined according to a time difference between the feedback signal to be cancelled and the output signal after the combination with the current feedback cancellation signal.

The method may further include determining a final weighted value by adding the weighted value to an existing weighted value, and applying the final weighted value to the one or more adaptive filters.

The method may further include applying the time offset value to a delay function of the one or more adaptive filters such that a time offset of the further feedback cancellation signal corresponds to a time offset of a feedback signal to be cancelled.

According to another embodiment of the present invention, a method of cancelling feedback from a received signal includes: combining the received signal with a feedback cancellation signal; comparing the received signal before the combination with an output signal after the combination; determining a weighted value and a time offset value for each feedback signal of a plurality of feedback signals to be cancelled, based on the comparison; and adjusting, by one or more adaptive filters, the feedback cancellation signal based on the weighted value and the time offset value for each of the feedback signals.

BRIEF DESCRIPTION OF THE DRAWINGS

The above and other aspects and features of the present invention will be more clearly understood from the following detailed description taken in conjunction with the accompanying drawings, in which.

DETAILED DESCRIPTION

Figure 1:
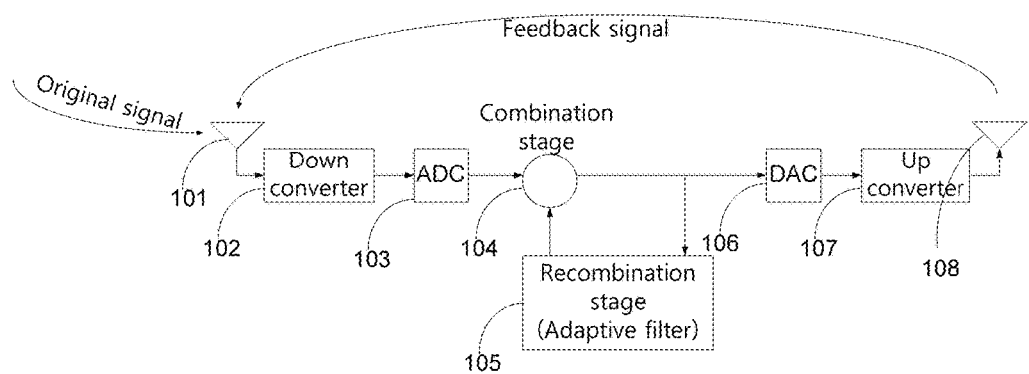
FIG. 1 is a block diagram of a mobile telecommunication repeater for cancelling a feedback signal.
Figure 2:
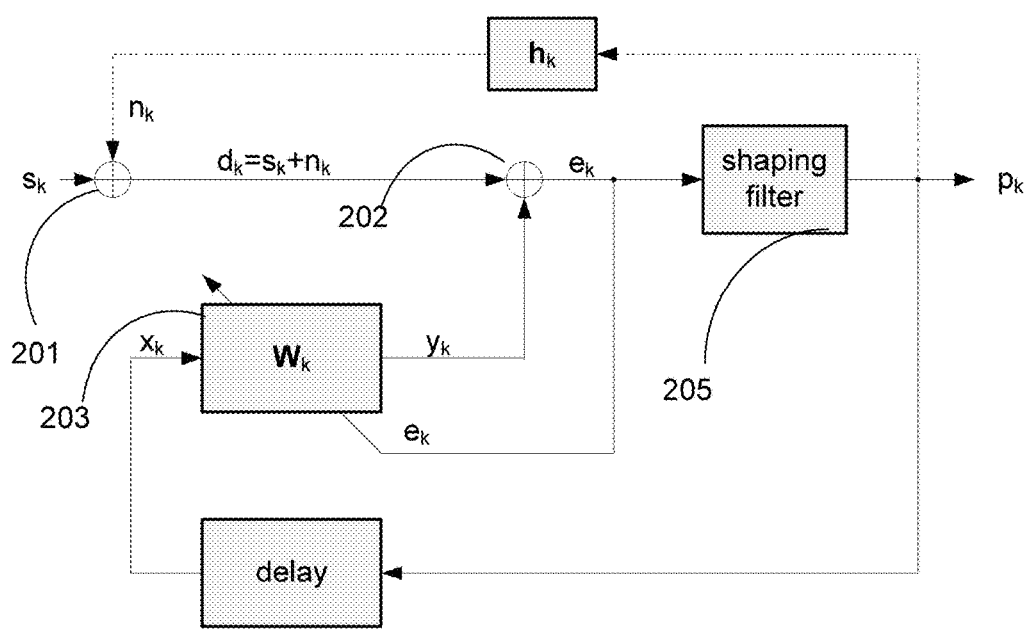
FIG. 2 is a block diagram of an adaptive filter used in the repeater of FIG. 1.
Figure 3:
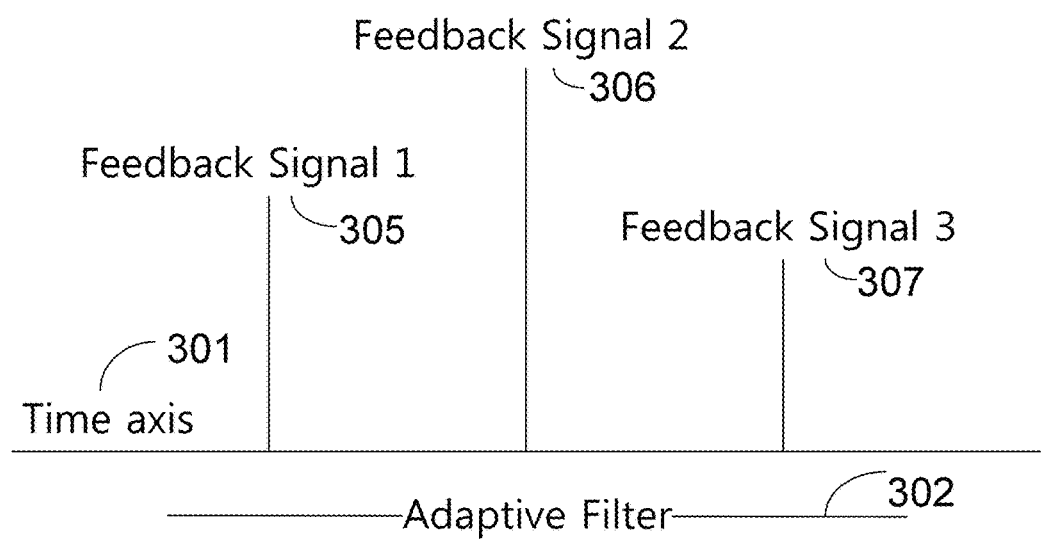
FIG. 3 illustrates a method of processing feedback signals on a time axis when using a single adaptive filter.

Example embodiments of the present invention will be described in detail below, with reference to the accompanying drawings, to such an extent that those skilled in the art should be able to implement the technical spirit of embodiments according to the present invention. Reference should be made to the drawings, in which the same reference numerals are used throughout different drawings to designate the same or similar components. In the following description, redundant descriptions and detailed descriptions of known elements or functions that may be unnecessary to understand the thrust of the present invention may be omitted.

Aspects of the present invention address the issues described above. For example, a repeater according to embodiments of the present invention uses multiple adaptive filters or an adaptive filter composed of several units (or minimum units). According to aspects of the present invention, weighted values and delays of the feedback signals may be adjusted to achieve an improved (or optimal) condition depending on the status of the feedback signals.

Figure 4:
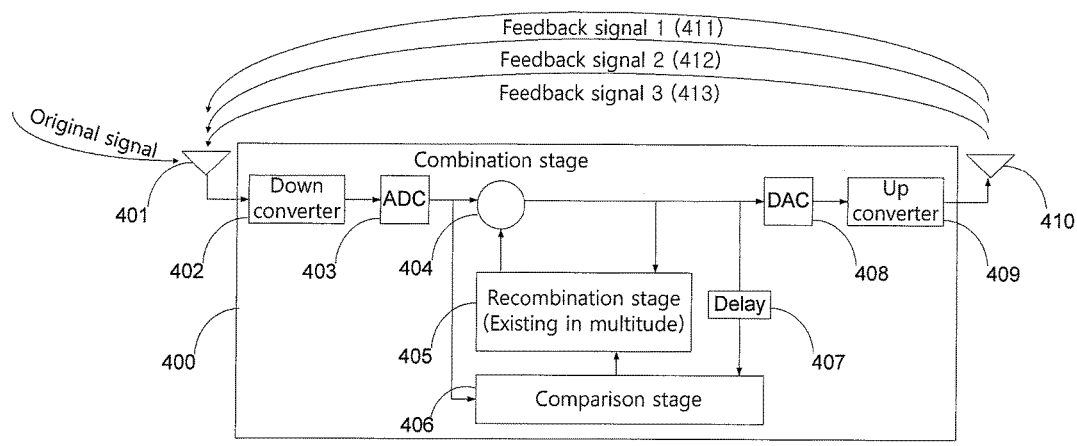
FIG. 4 is a block diagram of a mobile telecommunication repeater for cancelling a feedback signal according to an embodiment of the present invention.

FIG. 4 is a block diagram of a mobile telecommunication repeater for cancelling a feedback signal according to an embodiment of the present invention. As shown in FIG. 4, in one embodiment, a repeater 400 includes: a down-converter stage 402 that receives a wireless signal through a receiving antenna 401 and converts the received wireless signal to an intermediate frequency; an ADC stage 403 that converts the signal at the intermediate frequency to a digital signal; a combination stage 404 that combines the converted digital signal with an internally produced feedback cancellation signal; a comparison stage 406 that compares the characteristics of the signal before and after combination with the feedback cancellation signal at the combination stage 404, to determine (e.g., estimate) a weighted value for the feedback signal, and taking into account a time offset (or delay) of the feedback signal; a recombination (or regeneration) stage 405 that regenerates the internally produced feedback cancellation signal based on the weighted value and the delay information 407 determined (e.g., estimated) from the comparison stage 406; a DAC stage 408 that converts the signal output from the combination stage 404 to an analog signal at an intermediate frequency; and an up-converter stage 409 that converts the analog signal at the intermediate frequency to a wireless RF signal and outputs the wireless RF signal to a transmitting antenna 410.

According to embodiments of the present invention, the comparison stage 406 compares the output signal of the combination stage 404 with the input signal of the combination stage 404. That is, the comparison stage 406 compares characteristics of the signal before and after combination with the feedback cancellation signal. The comparison may be used to determine how much of the feedback signals were removed by the feedback cancellation signal.

For example, in one embodiment the comparison stage 406 compares the input signal of the combination stage 404, which may include the feedback signals 411, 412, 413, and the output signal of the combination stage 404 after feedback cancellation. The correlation result between the input and output signals of the combination stage 404 shows how much of the feedback signals are currently cancelled.

In one embodiment, the comparison stage 406 measures (e.g., separately measures) the total sum of energies cancelled by determining a difference between the feedback signal to be cancelled and the output signal after feedback cancellation, taking into account the time offsets for respective feedback signals. This determination may be made, for example, by calculating correlations ($Z_k$) for two signals ($X_i$, $Y_i$) as in Equation (2).

$$Z_k = \frac{1}{L}\sum_{i=0}^{L-1} X_i Y_{i-k}, 0 < k < L \qquad (2)$$

Equation (2) calculates how much correlation there is for the signals $X_i$ and $Y_i$ as a function of time, where $X_i$ is the inputted signal and $Y_i$ is the outputted signal. For example, the correlation shows how much of the outputted signal $Y_i$ exists in the inputted signal $X_i$, that is, how much of the feedback signal fed from the output signal $Y_i$ is included in the input signal $X_i$. Also, the magnitudes and delay offsets for each of the feedback signals may be measured using the calculated correlation result.

In one embodiment, the comparison stage 406 determines (e.g., estimates) a weighted value for a feedback signal to be cancelled based on the energy difference between the feedback signal to be cancelled and the output signal after feedback cancellation.

According to an embodiment, the recombination (or regeneration) stage 405 regenerates the feedback cancellation signal based on the weighted value determined (e.g., estimated) by the comparison stage 406. In order to perform more precise processing of the characteristics of the feedback signal to be cancelled, the signal for feedback cancellation is generated with an offset on the time axis (e.g., a delay) corresponding to the time difference between the feedback signal to be cancelled and the output signal after feedback cancellation. The use of such time offsets may reduce the number of coefficients of the adaptive filters produced beforehand in the processing of the feedback signals for cancellation, and may allow the use of a reduced number of coefficients from the total produced coefficients. In other words, only required coefficients of the adaptive filters may be used.

Individual delays and weighted values for each of the feedback signals are adjusted at the recombination (or regeneration) stage 405 to generate signals for feedback cancellation corresponding to the individual delays of each of the feedback signals. The use of adjusted (or variable) delays and weighted values may reduce or prevent inefficient use (or wasting) of adaptive filters due to differences in time offset between feedback signals. Therefore, according to aspects of embodiments of the present invention, higher-quality servicing of the signal may be achieved.

Figure 5:
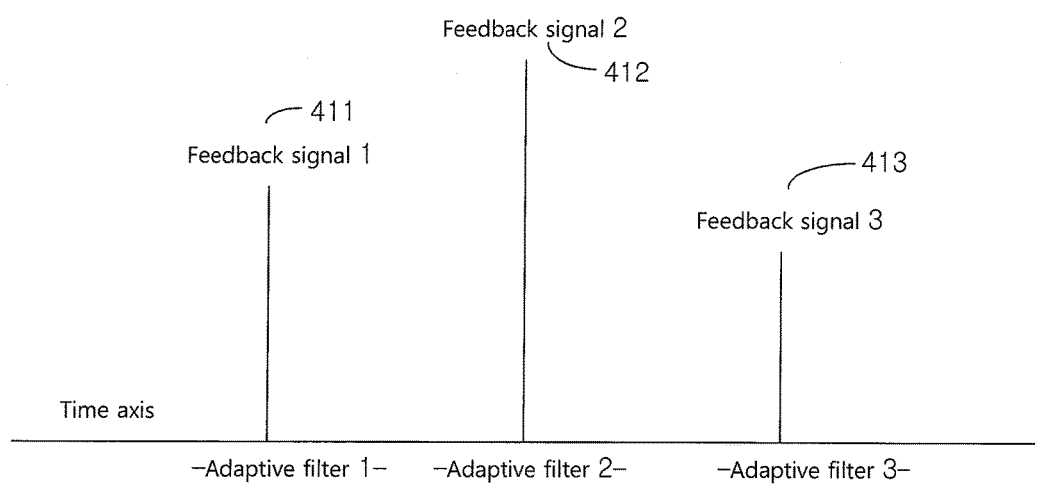
FIG. 5 illustrates a method of processing method feedback signals on a time axis according to an embodiment of the present invention.

In the embodiment of FIG. 4, feedback signals 411, 412, 413 having different delay offsets are respectively inputted into the receiving antenna 401. Feedback signals 411, 412, 413 may represent, for example, feedback from the external environment. The calculated correlation between the input signal of the combination stage 404 and the output signal of the combination stage 404 (which is also the input signal of the comparison stage 406) using Equation (2) may be, for example, as shown in FIG. 5. The magnitudes and delay offsets for each of the feedback signals 411, 412, 413 in FIG. 5 may be measured using the calculated correlation result. If the feedback signals are completely removed, the correlation between the input signal of combination stage 404 and the output signal of the combination stage 404 (which is also the input signal of the comparison stage 406) does not appear, and the weighted value is adjusted to a minimum value.

Figure 6:
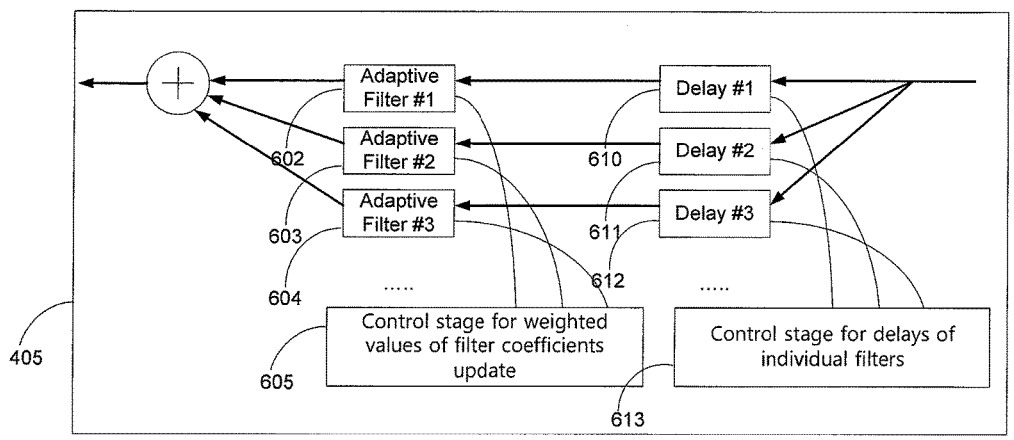
FIG. 6 is a block diagram representing a method of realizing weighted values and delay adjustments for feedback signals at multiple regeneration stages according to an embodiment of the present invention.

FIG. 6 is a block diagram representing a method of realizing weighted values and delay adjustments for feedback signals at multiple regeneration stages according to an embodiment of the present invention. As shown in FIG. 6, the recombination (or regeneration) stage 405 of FIG. 4 may include several adaptive filters 602, 603, 604, several variable delays 610, 611, 612, a controller (or control stage) 605 for updating the weighted values of filter coefficients according to the weighted values determined (e.g., estimated) by the comparison stage 406, and a controller (or control stage) 613 for adjusting delays (e.g., variable delays) of individual filters for the feedback signals. According to an embodiment, the recombination (or regeneration) stage 405 is controlled through the controller 605 which updates the weighted values of filter coefficients, and the controller 613 which adjusts delays (e.g., variable delays) of individual filters for the feedback signals.

Adjustment of the weighted values may be proportional to the energy of the non-cancelled feedback signals determined (e.g., calculated) at the comparison stage 406. When the energy of the non-cancelled feedback signals determined (e.g., calculated) at the comparison stage 406 is zero or does not exist, the weighted value may be adjusted to a minimum value so that the stable state of the adaptive filters may be maintained.

In one embodiment, the recombination (or regeneration) stage 405 produces a final weighted value by adding the weighted value provided by the comparison stage 406 to the existing weighted value which is currently being applied to the adaptive filter. Additionally, the number of adaptive filters may be reduced (or minimized) by substituting the existing time offset value with the time offset value provided by the comparison stage 406 to coincide with the actual time offset value of the feedback signal to be cancelled, thereby more accurately matching the actual feedback signal to be cancelled. In some embodiments, multiple time offsets may be provided by the comparison stage 406, as a result of which a multitude of regeneration stages may exist.

FIG. 5 illustrates a method of processing feedback signals on a time axis according to an embodiment of the present invention. According to an embodiment, the recombination (or regeneration) stage 405 may include multiple mutually independent adaptive filters 1, 2, 3, which enable independent (or separate) adjustment of the weighted values and time offsets for each of the feedback signals 411, 412, 413. The adaptive filters 1, 2, 3 provide adjustable delay functions for each of the delays (e.g., delays 610, 611, 612 in FIG. 6) and a function that can adjust the weighted value of Equation (1) for each of the feedback signals 411, 412, 413.

Although example embodiments of the present invention have been disclosed for illustrative purposes, those skilled in the art will appreciate that various modifications, additions, and substitutions are possible, without departing from the scope and spirit of the invention as disclosed in the accompanying claims, and their equivalents.

| | Description of Some of the Reference Numerals |
|---|---|
| 101 | Input (or receiving) antenna |
| 102 | Down-converter |
| 103 | Analog to Digital Converter |
| 104 | Combination stage |
| 105 | Recombination (or regeneration) stage |
| 106 | Digital to Analog Converter |
| 107 | Up-converter |
| 108 | Output (or transmitting) antenna |
| 201 | Combination element for combination of the input and the feedback signals |
| 202 | Combination element for combination of the output of the adaptive filter and the output of combination element 201 |
| 203 | Adaptive filter |
| 205 | Shaping (or final) filter |
| 301 | Time axis |
| 302 | Adaptive filter |
| 305 | Feedback signal 1 on the time axis |
| 306 | Feedback signal 2 on the time axis |
| 307 | Feedback signal 3 on the time axis |
| 404 | Combination stage |
| 406 | Comparison stage |
| 411 | Feedback signal 1 on the time axis |
| 412 | Feedback signal 2 on the time axis |
| 413 | Feedback signal 3 on the time axis |
| 602 | Adaptive filter 1 |
| 603 | Adaptive filter 2 |
| 604 | Adaptive filter 3 |
| 605 | Controller (or control stage) for updating weighted values of filter coefficients |
| 610 | Adjustable (or variable) delay 1 for the input signal of the adaptive filter |
| 611 | Adjustable (or variable) delay 2 for the input signal of the adaptive filter |
| 612 | Adjustable (or variable) delay 3 for the input signal of the adaptive filter |
| 613 | Controller (or control stage) for adjusting input delays of multiple adaptive filters |

What is claimed is:

1. A mobile telecommunication wireless repeater comprising:

a combination stage for combining a received signal with a feedback cancellation signal;

an adjustable delay for variably delaying an output signal of the combination stage;

a comparison stage for comparing an input signal corresponding to the received signal that is input to the combination stage with the delayed output signal of the combination stage that is delayed by the adjustable delay, and determining and outputting respective weighted values and time offset values for a plurality of feedback signals to be cancelled based on the comparison, wherein first and second ones of the feedback signals are separated by a long time delay interval; and a recombination stage configured to directly receive the output signal of the combination stage prior to the output signal being delayed by the adjustable delay, and to generate the feedback cancellation signal from the output signal of the combination stage based on the output from the comparison stage, the recombination stage comprising a plurality of paths arranged in parallel, wherein each of the paths comprises a delay function and a corresponding adaptive filter, and wherein each of the delay functions is directly connected to a common first node and each of the adaptive filters is directly connected to a common second node for combining respective output signals of the adaptive filters;

wherein the adaptive filters are configured to receive respective ones of the weighted values and the delay functions are configured to receive respective ones of the time offset values from the comparison stage corresponding to respective ones of the feedback signals, wherein a weight of a filter coefficient of the adaptive filter for each path and the time offset value associated with each path are both independently adjustable based at least on the output from the comparison stage, and wherein the recombination stage is configured to generate the feedback cancellation signal according to the combined output signals from the adaptive filters that correspond to the weighted values and the time offset values for the plurality of the feedback signals.

2. The mobile telecommunication wireless repeater of claim 1, wherein the comparison stage is configured to determine each of the weighted values based on an energy difference between the corresponding feedback signal to be cancelled and the output signal of the combination stage after feedback cancellation, and to provide the weighted values to the recombination stage.

3. The mobile telecommunication wireless repeater of claim 1, wherein when the feedback signals are completely cancelled, the weighted values are adjusted to minimum values.

4. The mobile telecommunication wireless repeater of claim 1, wherein the comparison stage is configured to determine each of the time offset values based on a time difference between the corresponding feedback signal to be cancelled and the output signal of the combination stage after feedback cancellation, and to provide the time offset values to the recombination stage.

5. The mobile telecommunication wireless repeater of claim 1, wherein the recombination stage is configured to determine a final weighted value by adding the weighted values determined by the comparison stage to an existing weighted value, and to apply the final weighted value to the adaptive filters.

6. The mobile telecommunication wireless repeater of claim 1, wherein the recombination stage is configured to apply the time offset values determined by the comparison stage to respective ones of the delay functions corresponding to each of the adaptive filters such that a time offset of the feedback cancellation signal corresponds to a time offset of a feedback signal to be cancelled.

7. The mobile telecommunication wireless repeater of claim 1, wherein each of the paths of the recombination stage is configured to adjust the time offset values of respective ones of the plurality of feedback signals to be cancelled.

8. The mobile telecommunication wireless repeater of claim 7, wherein each of the paths is configured to independently adjust respective ones of the time offset values.

9. The mobile telecommunication wireless repeater of claim 1, further comprising:

a receiving antenna for receiving the received wireless signal;

a down-converter stage for converting the received wireless signal to an intermediate frequency;

an Analog to Digital Converter (ADC) stage for converting the wireless signal of the intermediate frequency to a digital signal;

a Digital to Analog Converter (DAC) stage for converting the output signal of the combination stage to an analog signal of the intermediate frequency; and an up-converter stage for converting the analog signal of the intermediate frequency to a wireless RF signal and outputting the wireless RF signal to a transmitting antenna.

10. A method of cancelling feedback from a received signal, the method comprising:

combining the received signal with a current feedback cancellation signal;

delaying an output signal after the combination;

comparing an input signal corresponding to the received signal before the combination with the delayed output signal after the combination;

determining and outputting respective weighted values and time offset values for a plurality of feedback signals to be cancelled based on the comparison, wherein first and second ones of the feedback signals are separated by a long time delay interval; and utilizing a recombination stage to directly receive the output signal after the combination and prior to the output signal being delayed, and to generate a further feedback cancellation signal from the output signal after the combination based on the outputted respective weighted values and time offset values, the recombination stage comprising a plurality of paths arranged in parallel, wherein each of the paths comprises a delay function and a corresponding adaptive filter, wherein each of the delay functions is directly connected to a common first node and each of the adaptive filters is directly connected to a common second node for combining respective output signals of the adaptive filters, wherein the adaptive filters are configured to receive respective ones of the outputted weighted values and the delay functions are configured to receive respective ones of the outputted time offset values corresponding to respective ones of the feedback signals, and wherein a weight of a filter coefficient of the adaptive filter for each path and the time offset value associated with each path are both independently adjustable, to generate a further feedback cancellation signal based on the combined output signals from the adaptive filters that correspond to the weighted values and the time offset values for the plurality of the feedback signals; and applying the further feedback cancellation signal in place of the current feedback cancellation signal.

11. The method of claim 10, wherein each of the weighted values is determined according to an energy difference between the corresponding feedback signal to be cancelled and the output signal after combination with the current feedback cancellation signal.

12. The method of claim 10, wherein each of the time offset values is determined according to a time difference between the corresponding feedback signal to be cancelled and the output signal after the combination with the current feedback cancellation signal.

13. The method of claim 10, further comprising determining a final weighted value by adding the weighted values to an existing weighted value, and applying the final weighted value to the adaptive filters.

14. The method of claim 10, further comprising applying the time offset values to respective ones of the delay functions corresponding to each of the adaptive filters such that a time offset of the further feedback cancellation signal corresponds to a time offset of a feedback signal to be cancelled.

15. A method of cancelling feedback from a received signal, the method comprising:
   combining the received signal with a feedback cancellation signal;
   delaying an output signal after the combination;
   comparing an input signal corresponding to the received signal before the combination with the delayed output signal after the combination;
   determining and outputting a weighted value and a time offset value for each feedback signal of a plurality of feedback signals to be cancelled based on the comparison, wherein first and second ones of the feedback signals are separated by a long time delay interval; and
   utilizing a recombination stage to directly receive the output signal after the combination and prior to the output signal being delayed, and to adjust the feedback cancellation signal from the output signal after the combination based on the outputted respective weighted values and time offset values, the recombination stage comprising a plurality of paths arranged in parallel, wherein each of the paths comprises a delay function and a corresponding adaptive filter, and wherein each of the delay functions is directly connected to a common first node and each of the adaptive filters is directly connected to a common second node for combining respective output signals of the adaptive filters;
   wherein the adaptive filters are configured to receive respective ones of the outputted weighted values and the delay functions are configured to receive respective ones of the outputted time offset values corresponding to respective ones of the feedback signals, and wherein a weight of a filter coefficient of the adaptive filter for each path and the time offset value associated with each path are both independently adjustable, to adjust the feedback cancellation signal based on the combined output signals from the adaptive filters that correspond to the weighted values and the time offset values for the plurality of the feedback signals.

* * * * *